United States Patent [19]

Tanaka et al.

[11] Patent Number: 4,973,850
[45] Date of Patent: Nov. 27, 1990

[54] VARIABLE INCIDENT ANGLE EXPOSURE APPARATUS

[75] Inventors: Motoyuki Tanaka; Minoru Watanuki, both of Tokyo, Japan

[73] Assignee: ORC Manufacturing Co., Ltd., Tokyo, Japan

[21] Appl. No.: 474,933

[22] Filed: Feb. 5, 1990

[30] Foreign Application Priority Data

Apr. 21, 1989 [JP] Japan .................................. 1-102562

[51] Int. Cl.⁵ .............................................. G01J 1/00
[52] U.S. Cl. ................................ 250/492.1; 250/504 R
[58] Field of Search ..................... 250/492.1, 493, 504 R

[56] References Cited

U.S. PATENT DOCUMENTS

| | | | |
|---|---|---|---|
| 3,325,238 | 7/1967 | Geier | 250/504 R |
| 4,019,062 | 4/1977 | Rongren | 250/504 R |
| 4,687,933 | 8/1987 | Loy | 350/6.8 |
| 4,704,521 | 11/1987 | Loy | 350/6.8 |
| 4,707,609 | 11/1987 | Shimamura | 250/492.1 |
| 4,710,638 | 12/1987 | Wood | 250/492.1 |
| 4,849,640 | 7/1989 | Kruishoop | 250/492.1 |

Primary Examiner—Bruce C. Anderson
Attorney, Agent, or Firm—Cushman, Darby & Cushman

[57] ABSTRACT

A variable incident angle exposure apparatus wherein the incident angle of exposure light can be set as desired. The apparatus comprises a cold type elliptical reflecting mirror provided in a casing having a window for exposure at which a workpiece is disposed, a spot light source for ultraviolet rays disposed at the focal point of the elliptical reflecting mirror, a first cold type plane reflecting mirror fixed at an angle of inclination of 45 degrees with respect to the horizontal plane to reflect the reflected light from the elliptical reflecting mirror, a second cold type plane reflecting mirror fixed at an angle of inclination of 45 degrees with respect to the horizontal plane to reflect the reflected light from the first plane reflecting mirror, a relatively large cold type spherical reflecting mirror arranged to receive the reflected light from the second plane reflecting mirror through a fly-eye lens for making compensation for chromatic aberration and reflect the received light in the form of parallel rays, and a movable reflecting mirror arranged to reflect the parallel rays from the large spherical reflecting mirror toward the exposure window, the angle of inclination of the movable reflecting mirror being variable so that the parallel rays are incident on the exposure window at a desired incident angle.

4 Claims, 2 Drawing Sheets

VARIABLE INCIDENT ANGLE EXPOSURE APPARATUS

BACKGROUND OF THE INVENTION

1. Field of the Invention

The present invention relates to a variable incident angle exposure apparatus and, more particularly, to an exposure apparatus designed so that the incident angle of parallel rays for exposure can be varied as desired.

2. Description of the Related Art

There has heretofore been no apparatus of the type described above. Therefore, it has been impossible to produce a light-shielding screen having a light-shielding film with an oblique angle of incidence of light and hence impossible to make use of such an oblique incidence light-shielding screen, as a matter of course.

Hitherto, light-shielding screens having light shielding films with an incident angle of zero (light-shielding screens of this type will hereinafter be referred to as vertical light-shielding screens) alone have been produced by stamper bonding or injection molding process using a molten resin material.

Since only vertical light-shielding screens have heretofore been produced by stamper bonding or injection molding process, there have been problems that it is impossible to set as desired an angle of inclination of the light-shielding film and thereby set as desired an angle of incidence of light which is to be transmitted and it is impossible to readily obtain light-shielding screens varying in the angle of the light-shielding films, from a desired angle of inclination to an inclination angle of zero. Further, it has heretofore been impossible with the conventional stamping or drawing process to produce light-shielding screens having light-shielding films with various kinds of configuration, for example, striped or honeycomb light-shielding films, although screens of this type have been demanded. For this reason, there have been limitations on the application of light-shielding films, for example, application to the surfaces of various kinds of display panels. In addition, the conventional manufacturing processes suffer from problems, for example, difficulty in obtaining light-shielding screens which are thin and have wide areas, for example, a light-shielding screen having a thickness of about 500mµ, an opening size of 30mµ and an area of 400×600 mm.

SUMMARY OF THE INVENTION

In view of the above-described problems of the prior art, it is a primary object of the present invention to provide a variable incident angle exposure apparatus designed so that the incident angle of exposure light can be set as desired, thereby enabling the angle of incidence of light which is to be transmitted by a light-shielding screen, for example, to be set as desired.

To this end, the present invention provides a variable incident angle exposure apparatus comprising: a cold type elliptical reflecting mirror provided in a casing having a window for exposure at which a workpiece is disposed; a spot light source for generating ultraviolet rays disposed at the focal point of the elliptical reflecting mirror; a first cold type plane reflecting mirror provided in the casing and fixed at an angle of inclination of 45 degrees with respect to the horizontal plane to reflect the reflected light from the elliptical reflecting mirror; a second cold type plane reflecting mirror constituted by a small-sized plane mirror which is provided in the casing and fixed at an angle of inclination of 45 degrees with respect to the horizontal plane to reflect the reflected light from the first plane reflecting mirror; a relatively large cold type spherical reflecting mirror provided in the casing with an angle of inclination to receive the reflected light from the second plane reflecting mirror through a fly-eye lens for making compensation for chromatic aberration and reflect the received light in the form of parallel rays; and a movable reflecting mirror provided in the casing to reflect the parallel rays from the large spherical reflecting mirror toward the exposure window, the angle of inclination of the movable reflecting mirror being variable so that the parallel rays are incident on the exposure window at a desired incident angle.

The movable reflecting mirror is connected at the lower end thereof to a moving member through a height adjusting means for finely adjusting the position in the vertical direction, the moving member being movable along a guide under the control of a control motor.

The exposure window is provided with a vacuum printing means which is rotated, aligned and changed in angle by means of a motor and to which the workpiece is attached.

By virtue of the above-described means, the light from the ultraviolet ray generating spot light source is reflected from the spherical reflecting mirror in the form of parallel rays, which are then made incident on the exposure window at a desired angle by means of the movable reflecting mirror, thus forming a light-shielding screen with a desired incident angle at the exposure window.

BRIEF DESCRIPTION OF THE DRAWINGS

The above and other objects, features and advantages of the present invention will become more apparent from the following description of the preferred embodiment thereof, taken in conjunction with the accompanying drawings, in which like reference numerals denote like members, and of which.

DETAILED DESCRIPTION OF THE PREFERRED EMBODIMENT

One embodiment of the present invention will be described below in detail with reference to the accompanying drawings.

Figure 1:
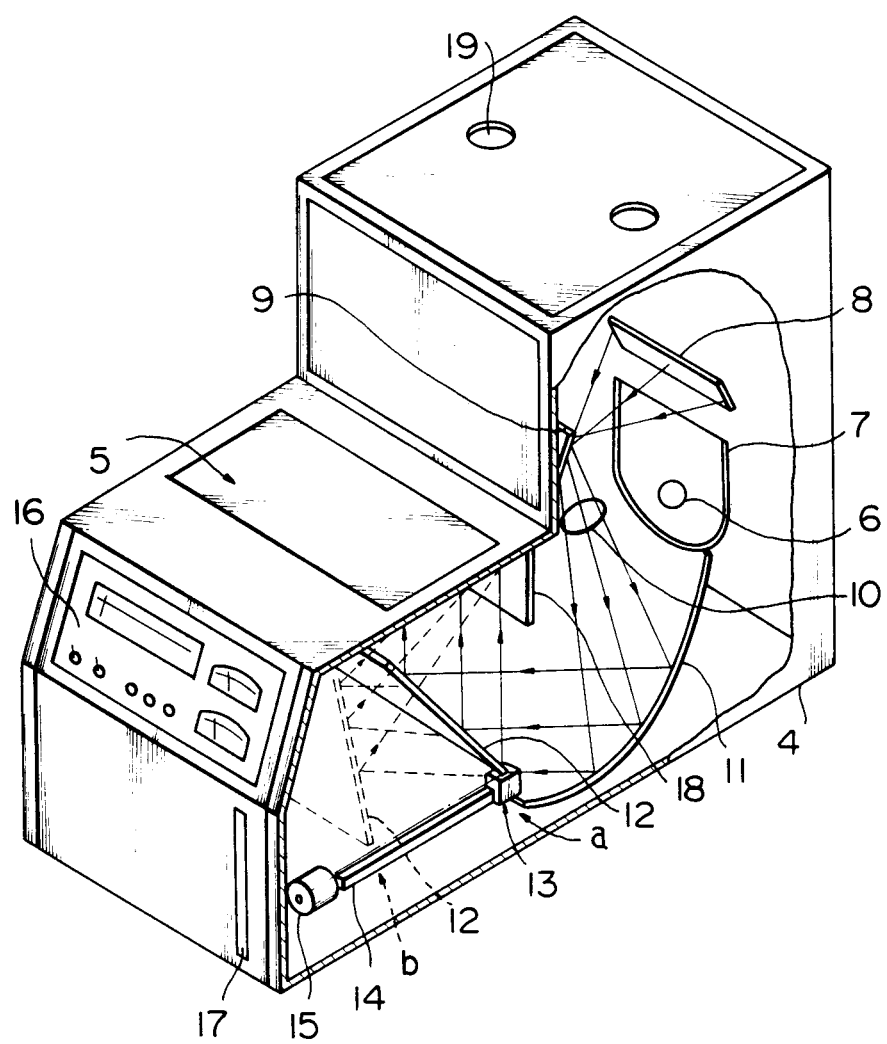
FIG. 1 is a partially-cutaway perspective view of one embodiment of the variable incident angle exposure apparatus according to the present invention.
Figure 2:
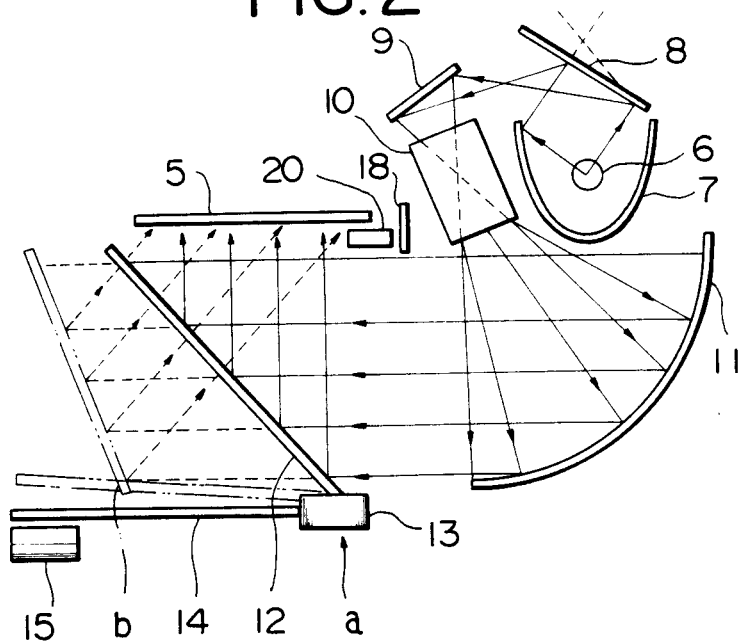
FIG. 2 shows the arrangement of the optical system in the embodiment.

FIG. 1 is a perspective view of one embodiment of the variable incident angle exposure apparatus according to the present invention, and FIG. 2 shows the arrangement of the optical system in this embodiment. In the figures, the reference numeral 4 denotes a casing and the numeral 5 denotes a window for exposure that is provided in the upper face of the casing 4. The exposure window 5 is provided with a vacuum printing means to which is attached a workpiece on which a light-shielding screen is to be formed, the vacuum printing means being arranged such that it can be moved, aligned and changed in angle by driving a motor associated therewith. A spot light source 6 for generating ultraviolet rays is provided in the rear part of the casing 4. The spot light source 6 is disposed at the focal point of a cold type elliptical reflecting mirror 7 so that light is radiated upward. The reference numeral 8 denotes a first plane reflecting mirror which is constituted by a cold mirror disposed above the elliptical reflecting mirror 7. The first plane reflecting mirror 8 is fixed at an angle of 45 degrees to the horizontal plane of the casing 4 so that the reflected light from the elliptical reflecting mirror 7 is reflected forwardly of the reflecting mirror 8. In front of the first plane reflecting mirror 8, a second plane reflecting mirror 9, constituted by a cold mirror which receives the reflected light from the first plane reflecting mirror 8 with a small-sized plane mirror, is fixed at an angle of 45 degrees to the horizontal plane of the casing 4 so that the second plane reflecting mirror 9 reflects the light downwardly. The reflected rays from the second plane reflecting mirror 9 are passed through a fly-eye lens 10 to make compensation for, for example, the chromatic aberration of the light. A relatively large cold type spherical reflecting mirror 11 which is molded out of a resin or glass material is disposed so as to be at an oblique angle to the prolonged lines of the light rays passing through the fly-eye lens 10. The spherical reflecting mirror 11 reflects the light from the fly-eye lens 10 in the form of expanded parallel rays toward the forward end of the casing 4 through the area below the exposure window 5. A movable plane reflecting mirror 12 is disposed below the exposure window 5, the reflecting mirror 12 being arranged such that it is movable along the longitudinal axis of the casing 4 and the angle of inclination of the mirror 12 is variable. When the movable plane reflecting mirror 12 is at the position a below the exposure window 5, it is inclined at an angle of 45 degrees so that the parallel rays are incident on the exposure window 5 at an incident angle of 0 degree. When the movable plane reflecting mirror 12 is moved forward to the position b shown by the broken line, it is raised to a substantial degree so that the parallel rays are incident on the exposure window 5 at an incident angle of 45 degrees. Such a movement of the movable plane reflecting mirror 12 is effected by an arrangement in which a moving member 13 is connected to the lower end of the movable plane reflecting mirror 12 and the movable member 13 is moved along a guide 14 by means of a control motor 15 so as to vary the inclination of the movable plane reflecting mirror 12. The reference numeral 16 denotes a control panel which is provided on the front face of the casing 4, and the numeral 17 denotes a scale which is also provided on the front face of the casing 4 for indicating the angle of inclination of the movable plane reflecting mirror 12. The reference numeral 18 denotes a suspended plate which is suspended from the casing 4 at a position above and forward of the spherical reflecting mirror 11 to prevent unnecessary light other than the parallel rays from leaking toward the exposure window 5. The reference numeral 19 denotes exhaust or discharge ports provided in the upper face of the casing 4 to release the heat generated from the ultraviolet ray generating spot light source 6 and other constituent elements. The reference numeral 20 denotes a motor for rotating the vacuum printing means provided at the exposure window 5.

Figure 3:
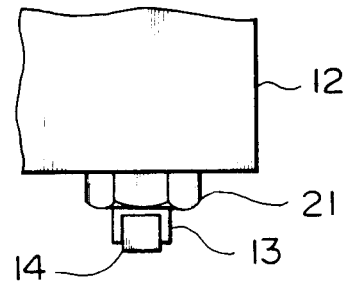
FIG. 3 is a front elevational view of a height adjusting means provided on the moving member shown in FIG. 2.

FIG. 3 shows a height adjusting means which is provided on the moving member 13 to effect fine adjustment of the position of the movable plane reflecting mirror 12 in the vertical direction. The arrangement is such that a nut 21 is disposed between the moving member 13 movably fitted on the guide 14 and the lower end of the movable plane reflecting mirror 12 and, by turning the nut 21, the height of the movable plane reflecting mirror 12 on the moving member 13 is finely adjusted. By the fine adjustment of the height, the position of the parallel rays relative to the exposure window 5 is finely adjusted.

The following is a description of the operation of the embodiment having the foregoing arrangement.

The light emitted from the ultraviolet ray generating spot light source 6 is condensed by the cold type elliptical reflecting mirror 7 to reach the relatively large cold type spherical reflecting mirror 11 via the first and second plate reflection mirrors 8 and 9 In the meantime, the heat ray component is also removed from the light at the first and second plane reflecting mirrors 8 and 9 which are constituted by cold mirrors. The light reaching the spherical reflecting mirror 11 is compensated for chromatic aberration by means of the fly-eye lens 10. The light that is incident on the spherical reflecting mirror 11 is reflected therefrom in the form of parallel rays, which then reach the movable plane reflecting mirror 12. Unnecessary light is intercepted by the suspended plate 18. The angle of inclination of the movable plane reflecting mirror 12 is set as desired by means of the control motor 15. Setting of the inclination is effected by activating the control motor 15 through the control panel 16 while checking the degree of inclination with the indicating scale 17. Accordingly, the parallel rays reaching the movable plane reflecting mirror 12 are made incident on the exposure window 5 at a desired incident angle. Therefore, if a workpiece on which a light-shielding screen is to be formed is disposed at the exposure window 5 and exposed to the parallel rays, it is possible to obtain a light-shielding screen having a light-shielding film with a desired angle of inclination.

Since the heat ray component is removed by the elliptical reflecting mirror 7, the first and second plane reflecting mirrors 8, 9 and the relatively large spherical reflecting mirror 11 and unnecessary light is intercepted by the suspended plate 18, parallel ultraviolet rays alone reach the exposure window 5. Accordingly, a high-quality light-shielding film is produced. Although the temperature rises around the ultraviolet ray generating spot light source 6, the presence of the exhaust ports 19 prevents the inside of the casing 4 from being raised in temperature.

Thus, according to the present invention, light from an ultraviolet ray generating spot light source is reflected from a spherical reflecting mirror in the form of parallel rays, which are then made incident on an exposure window at a desired incident angle by means of a movable reflecting mirror. It is therefore possible to form a light-shielding screen with a desired incident angle at the exposure window. Since the incident angle can be set as desired by varying the inclination of the movable reflecting mirror, it is possible to readily obtain light-shielding screens varying in the incident angle. In addition, since a vacuum printing means which is provided at the exposure window and to which is attached a workpiece on which a light-shielding screen is to be formed is rotated by means of a motor, it is possible to select as desired a direction of inclination of the light-shielding screen to be produced by rotating the motor.

Since it is possible to form parallel rays with a wide cross sectional area by means of a reflecting mirror, exposure can be effected over a wide area and it is therefore possible to readily obtain a light-shielding screen with a wide area.

Since light from the ultraviolet ray generating spot light source is reflected by means of reflecting mirrors constituted by cold mirrors, the heat ray component is removed and ultraviolet rays alone reach the exposure window. Thus, it is possible to effect high-quality exposure.

In addition, since the angle of inclination of the movable reflecting mirror can be set as desired electrically and externally by means of a control motor, the operation is easy and the desired inclination can be obtained accurately.

Although the present invention has been described through specific terms, it should be noted here that the described embodiment is not necessarily exclusive and that various changes and modifications may be imparted thereto without departing from the scope of the invention which is limited solely by the appended claims.

What is claimed is:

1. A variable incident angle exposure apparatus comprising:
    an elliptical reflecting mirror provided in a casing having a window for exposure at which a workpiece is disposed;
    a spot light source for generating ultraviolet rays disposed at the focal point of said elliptical reflecting mirror;
    a first plane reflecting mirror provided in said casing and fixed at an angle of inclination of 45 degrees with respect to the horizontal plane to reflect the reflected light from said elliptical reflecting mirror
    a second plane reflecting mirror constituted by small-sized plane mirror which is provided in said casing and fixed at an angle of inclination of 4 degrees with respect to the horizontal plane to reflect the reflected light from said first plane reflecting mirror;
    a relatively large spherical reflecting mirror provided in said casing with an angle of inclination to receive the reflected light from said second plane reflecting mirror through a fly-eye lens for making compensation for chromatic aberration and reflect the received light in the form of parallel rays; and
    a movable reflecting mirror provided in said casing to reflect the parallel rays from said large spherical reflecting mirror toward said exposure window the angle of inclination of said movable reflecting mirror being variable so that the parallel rays are incident on said exposure window at a desired incident angle.

2. A variable incident angle exposure apparatus according to claim 1, wherein all of said reflecting mirrors are constituted by cold mirrors.

3. A variable incident angle exposure apparatus according to claim 1, wherein said movable reflecting mirror is connected at the lower end thereof to a moving member through a height adjusting means for finely adjusting the position in the vertical direction, said moving member being movable along a guide under the control of a control motor.

4. A variable incident angle exposure apparatus according to claim 1, wherein said exposure window is provided with a vacuum printing means which is rotated, aligned and changed in angle by means of a motor and to which said workpiece is attached.

* * * * *